United States Patent
Karasawa

(10) Patent No.: US 10,381,243 B2
(45) Date of Patent: Aug. 13, 2019

(54) SEMICONDUCTOR MODULE HAVING SUPPORTING PORTION FOR FASTENING PORTION INSIDE A THROUGH HOLE IN A RESIN CASE

(71) Applicant: FUJI ELECTRIC CO., LTD., Kanagawa (JP)

(72) Inventor: Tatsuya Karasawa, Shiojiri (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/659,632

(22) Filed: Jul. 26, 2017

(65) Prior Publication Data
US 2018/0076053 A1  Mar. 15, 2018

(30) Foreign Application Priority Data
Sep. 14, 2016  (JP) ................. 2016-180013

(51) Int. Cl.
*H01L 23/04* (2006.01)
*H05K 7/00* (2006.01)
(Continued)

(52) U.S. Cl.
CPC .......... *H01L 21/4817* (2013.01); *H01L 21/52* (2013.01); *H01L 21/54* (2013.01); *H01L 23/04* (2013.01); *H01L 23/16* (2013.01); *H01L 23/057* (2013.01); *H01L 23/24* (2013.01); *H01L 23/3735* (2013.01); *H01L 24/29* (2013.01); *H01L 24/32* (2013.01); *H01L 24/48* (2013.01); *H01L 24/49* (2013.01); *H01L 2224/04042* (2013.01); *H01L 2224/291* (2013.01); *H01L 2224/32225* (2013.01); *H01L 2224/48091* (2013.01); *H01L 2224/48227* (2013.01); *H01L 2224/49111* (2013.01); *H01L 2224/73265* (2013.01); *H01L 2924/13055* (2013.01); *H01L 2924/13091* (2013.01)

(58) Field of Classification Search
CPC ..... H01L 24/32; H01L 24/46; H01L 21/4817; H01L 21/52; H01L 21/54; H01L 23/04; H01L 23/16; H01L 23/4006
See application file for complete search history.

(56) References Cited

U.S. PATENT DOCUMENTS

| 5,229,641 A * | 7/1993 | Katayama ......... G06K 19/0706 235/492 |
| 5,825,085 A | 10/1998 | Masumoto et al. |

(Continued)

FOREIGN PATENT DOCUMENTS

| JP | H09-69603 A | 3/1997 |
| JP | 2003-188344 A | 7/2003 |

(Continued)

*Primary Examiner* — Alonzo Chambliss

(57) ABSTRACT

A semiconductor module in which no crack of a metal film exists in a terminal is provided. A semiconductor module is provided, including: a semiconductor element; a terminal with a metal film formed on a surface and including a bent portion; a resin case to which the terminal is fixed and in which a through hole is formed opposite to the terminal, the resin case housing a semiconductor element; a fastening portion provided inside the through hole; and a supporting portion provided inside the through hole and supporting the fastening portion.

11 Claims, 8 Drawing Sheets

(51) Int. Cl.
  *H05K 7/02* (2006.01)
  *H01L 21/48* (2006.01)
  *H01L 23/16* (2006.01)
  *H01L 21/52* (2006.01)
  *H01L 21/54* (2006.01)
  *H01L 23/057* (2006.01)
  *H01L 23/00* (2006.01)
  *H01L 23/373* (2006.01)
  *H01L 23/24* (2006.01)

(56) References Cited

U.S. PATENT DOCUMENTS

| | | | | |
|---|---|---|---|---|
| 6,521,983 | B1* | 2/2003 | Yoshimatsu | H01L 25/072 |
| | | | | 257/678 |
| 8,581,379 | B2* | 11/2013 | Kure | H01L 23/49582 |
| | | | | 257/676 |
| 9,576,913 | B2* | 2/2017 | Soyano | H02M 7/003 |
| 2003/0151128 | A1* | 8/2003 | Kawaguchi | H01L 25/072 |
| | | | | 257/691 |
| 2006/0067059 | A1* | 3/2006 | Ushijima | H01L 25/162 |
| | | | | 361/715 |
| 2014/0376184 | A1* | 12/2014 | Gohara | H01L 23/473 |
| | | | | 361/689 |

FOREIGN PATENT DOCUMENTS

| | | |
|---|---|---|
| JP | 2005-277012 A | 10/2005 |
| JP | 2007-036896 A | 2/2007 |
| JP | 2010-098036 A | 4/2010 |
| JP | 2013-065598 A | 4/2013 |
| JP | 2015023226 A | 2/2015 |

\* cited by examiner

SEMICONDUCTOR MODULE HAVING SUPPORTING PORTION FOR FASTENING PORTION INSIDE A THROUGH HOLE IN A RESIN CASE

The contents of the following Japanese patent application are incorporated herein by reference:
NO. 2016-180013 filed in JP on Sep. 14, 2016.

BACKGROUND

1. Technical Field

The present invention relates to a semiconductor module and a method of manufacturing the semiconductor module.

2. Related Art

Conventionally, a semiconductor module housing a semiconductor element such as a power semiconductor element in a resin case has been known. A terminal is provided on the resin case. The terminal connects the semiconductor element to external electronic components. A plated film is formed as a metal film on a surface of the terminal. The terminal is folded so as to overlap a fastening portion such as a nut inside the resin case.

In a method of manufacturing the semiconductor module, after the nut is put in the resin case from an upper portion of the resin case, the terminal is folded so as to overlap the position of the nut. However, as the terminal is folded, a crack of the plated film is easily generated in a bent portion of the terminal. Here, in order to prevent the crack of the plated film, a manufacturing method has been known, the manufacturing method for secondary molding by loading a terminal with a plated film formed after a folding process and a resin case into which a nut is inserted and fixed in a mold (for example, refer to Patent Document 1). Also, technical documents relating to the present application are as the followings.

PRIOR ART DOCUMENTS

Patent Document

[Patent Document 1] Japanese Patent Application Publication 2010-98036
[Patent Document 2] Japanese Patent Application Publication 2007-36896

SUMMARY

As a crack of a metal film such as a plated film exists, since the terminal is discolored due to oxidization and the like, the appearance of the terminal is impaired. Therefore, in the semiconductor module, it is preferable that no crack exists in the metal film formed on a surface of the terminal.

In a first aspect of the present invention, a semiconductor module is provided. The semiconductor module may include a semiconductor element, a terminal, a resin case, a fastening portion, and a supporting portion. A metal film may be formed on a surface of the terminal. The terminal may include a bent portion. The terminal may be fixed to the resin case. In the resin case, a through hole may be formed opposite to the terminal. The resin case may house the semiconductor element. The fastening portion may be provided inside the through hole. The supporting portion may be provided inside the through hole and support the fastening portion.

The supporting portion may be formed of resin. The semiconductor module may include a fixing portion which fixes the supporting portion to the resin case.

The fastening portion may be arranged inside the through hole so as to be spaced from the terminal.

In the through hole, no resin exists between the fastening portion and the terminal.

An upper end of the supporting portion may be positioned lower than a front surface of the resin case.

In the supporting portion, a concave portion housing a bolt may be formed. The bolt may be joined to the fastening portion. A distance from the upper end of the supporting portion to a bottom portion of the concave portion may be longer than a distance from the upper end of the supporting portion to the fixing portion.

In the bent portion, no crack of the metal film exists.

In a second aspect of the present invention, a method of manufacturing a semiconductor module is provided. The method of manufacturing the semiconductor module may include a preparation step, an inserting step, and a sealing step. According to the preparation step, a terminal and a resin case may be prepared. The terminal may be plated and include a bent portion. The terminal may be fixed to the resin case. A through hole may be formed in the resin case. The through hole may be positioned opposite to the terminal. According to the inserting step, a fastening portion and a supporting portion may be inserted into the through hole. The supporting portion may support the fastening portion. According to the sealing step, a semiconductor element may be housed and sealed in the resin case. The preparation step may further include a bending step, a plating step, and a resin molding step. According to the bending step, the terminal may be bent. According to the plating step, the bent terminal may be plated. According to the resin molding step, after loading the plated terminal in a mold, the resin is injected in the mold to mold the resin case. In the resin case, a through hole may be formed opposite to the terminal.

The method of manufacturing the semiconductor module may further include a welding step. According to the welding step, the supporting portion and the resin case may be ultrasonic-welded.

Note that the summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
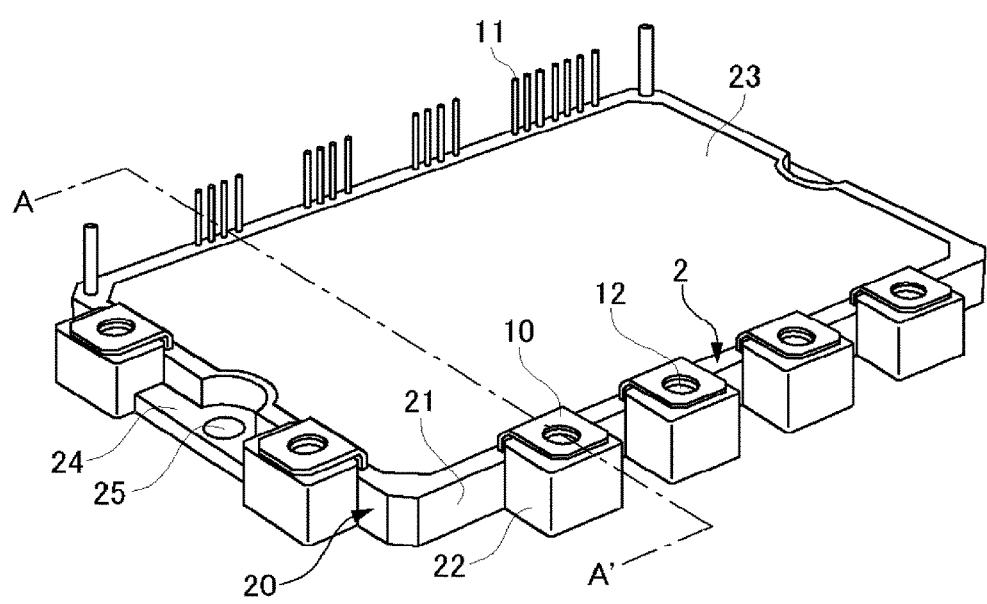
FIG. 1 is a perspective view showing a semiconductor module 1 of a first embodiment of the present invention.

FIG. 1 is a perspective view showing a semiconductor module 1 of a first embodiment of the present invention. The semiconductor module 1 includes a resin case 20 and one or more external terminals 10. The resin case 20 houses a semiconductor element. The resin case 20 is formed of thermoplastic resin such as polyphenylene sulfide resin (PPS resin) or polybutylene terephthalate resin (PBT resin). The external terminal 10 is fixed to the resin case 20. The external terminal 10 is a metal terminal electrically connecting an internal circuit, such as a semiconductor element, housed in the resin case 20 to an electronic component outside the resin case 20. A tip portion of the external terminal 10 is exposed on a front surface 2 side of the resin case 20. The semiconductor module 1 may include a plurality of control terminals 11, in addition to the external terminal 10. The control terminal 11 extends in a direction of normal line of the front surface 2 of the resin case 20. The surface of the control terminal 11 is plated with Tin-copper alloy. When connecting the power semiconductor module 1 to a printed substrate via the control terminal 11, the control terminal 11 may be inserted into a terminal with a hole of the printed substrate to be soldered.

Note that the front surface 2 of the resin case 20 refers to any surface of the surfaces that the resin case 20 has, and is not limited to a surface on an opposite side to the ground. Also, the terms herein representing directions such as "upper" and "lower" are not based on the gravity direction and refer to relative directions.

The resin case 20 of the present example substantially has a cuboid shape. However, each surface of the cuboid is not limited to a flat surface, and an appropriate unevenness, a notch, and the like may be formed in each surface. In the resin case 20, a surface on an opposite side to the front surface 2 is referred to as a back surface, and a surface connecting the front surface 2 to the back surface is referred to as a side surface. Also, a direction facing the front surface 2 from the back surface is set as an upper direction, and a direction facing the back surface from the front surface 2 is set as a lower direction.

The resin case 20 may include a wall portion 21 provided so as to surround a region in which an internal circuit including the semiconductor element is provided. In a part of the wall portion 21, a terminal placement portion 22 may be formed on the front surface 2 side. The wall portion 21 and the terminal placement portion 22 may be formed integrally. Although in the present example the terminal placement portion 22 is configured in a shape protruding to a side-surface direction from the wall portion 21, the applicable shape is not limited to this shape. The wall portion 21 may serve also as the terminal placement portion 22. The resin case 20 of the present example is merely one example, and the resin case 20 is not limited to that shown in FIG. 1.

The present invention can be applied to any resin case 20 with a terminal for electric conduction extending along a surface of the resin case 20, regardless of the shape of the resin case 20 and the arrangement of the external terminal 10.

A space surrounded by the wall portion 21 is filled with a sealing resin 23 for sealing the semiconductor element and the like. The semiconductor module 1 may further include a cover portion which covers the space surrounded by the wall portion 21. The cover portion may be fixed to a surface of at least a part of the wall portion 21. In a part of the resin case 20, a mounting portion 24 for mounting the resin case 20 in an external board and the like may be formed. As one example, the mounting portion 24 is formed with a thickness in a vertical direction thinner than that of the wall portion 21 and the terminal placement portion 22. A mounting hole 25 into which a bolt or the like is inserted is formed in the mounting portion 24.

The external terminal 10 of the present example has a plate shape. A base end portion of the external terminal 10 penetrates inside the wall portion 21 of the resin case 20 and extends to the space where the internal circuit is provided. A terminal hole 12 is formed in the tip portion of the external terminal 10. By inserting a screw such as a bolt into the terminal hole 12, the semiconductor module 1 is fixed to an external bus bar and the like. The external terminal 10 is folded and arranged so that the tip portion where the terminal hole 12 is formed overlaps the terminal placement portion 22 of the resin case 20.

Figure 2:
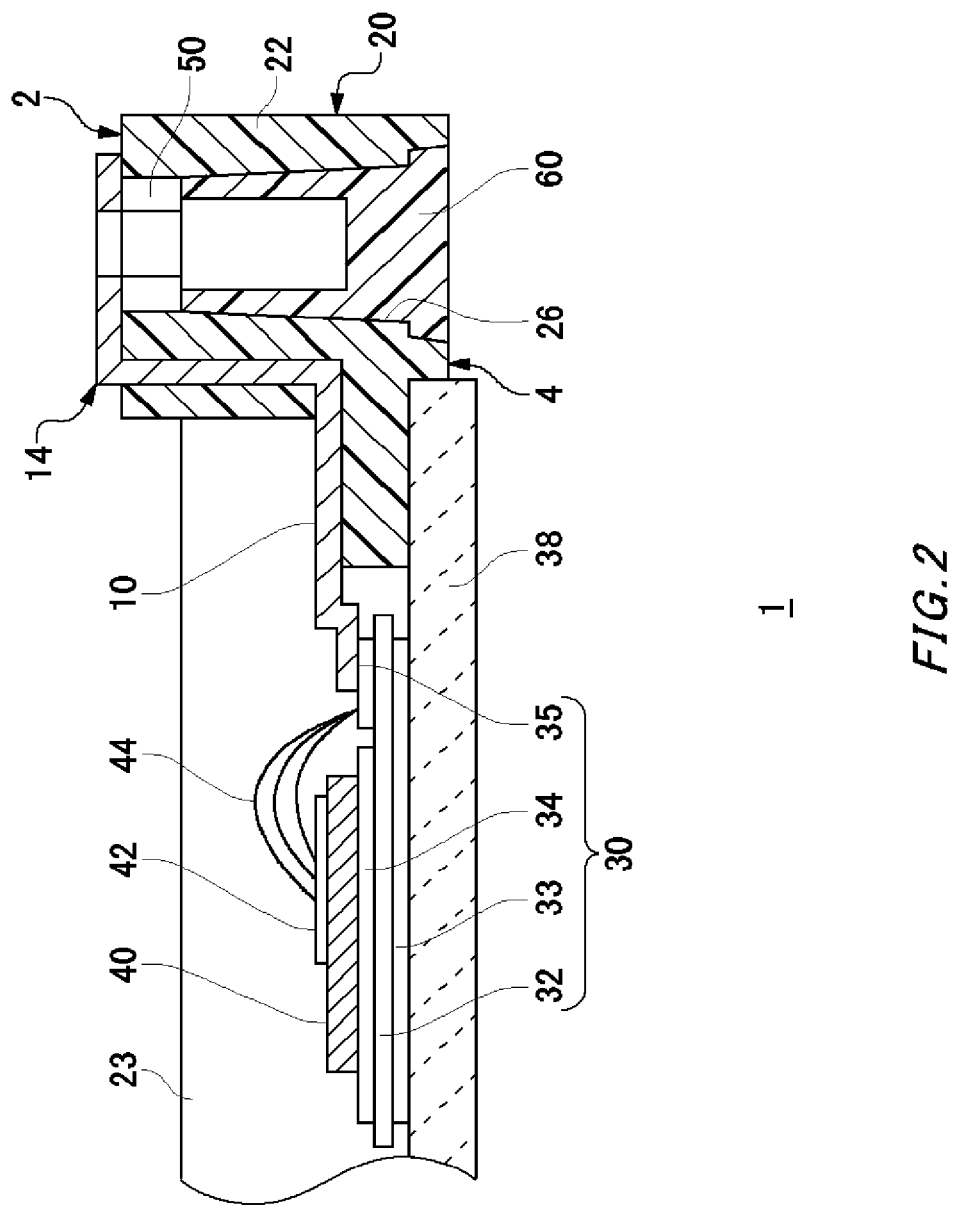
FIG. 2 is a drawing showing one example of an A-A' cross section in FIG. 1.

FIG. 2 is a drawing showing one example of an A-A' cross section in FIG. 1. The semiconductor module 1 includes a semiconductor element 40, the external terminal 10, the resin case 20, a nut 50, and a supporting portion 60. Also, a metal base plate 38 may be adhered to a part of the back surface 4 side of the resin case 20. The metal base plate 38 functions as a heat radiation plate.

A laminated substrate 30 is joined to a front surface of the metal base plate 38. The laminated substrate 30 may include an insulation layer 32, a metal layer 33, a circuit layer 34, and a connection layer 35. The metal layer 33 is formed on a back surface side of the insulation layer 32. By solder bonding the metal layer 33 to the metal base plate 38, the metal base plate 38 and the laminated substrate 30 are joined to each other. The circuit layer 34 and the connection layer 35 may be formed on a front surface side of the insulation layer 32. The semiconductor element 40 is connected to the circuit layer 34 by solder bonding.

The semiconductor element 40 may include an Insulated Gate Bipolar Transistor (IGBT) or a power metal-oxide-semiconductor field-effect transistor (MOSFET). The electrode 42 of the semiconductor element 40 and the connection layer 35 may be electrically connected to each other by a bonding wire 44 or an internal electric conduction terminal. The external terminal 10 may be electrically connected to the semiconductor element 40 via the connection layer 35 or the circuit layer 34. In the semiconductor module 1, the sealing resin 23 protects the internal circuit such as the semiconductor element 40 and the bonding wire 44.

In the resin case 20, a through hole 26 is formed, the through hole 26 penetrating between the front surface 2 and the back surface 4. The through hole 26 is formed in a position opposite to the tip portion of the external terminal 10. In the present example, the through hole 26 is formed in the terminal placement portion 22 of the resin case 20. The external terminal 10 includes a bent portion 14. The nut 50 functions as the fastening portion provided inside the through hole 26. The supporting portion 60 is provided inside the through hole 26 to support the nut 50.

Figure 3:
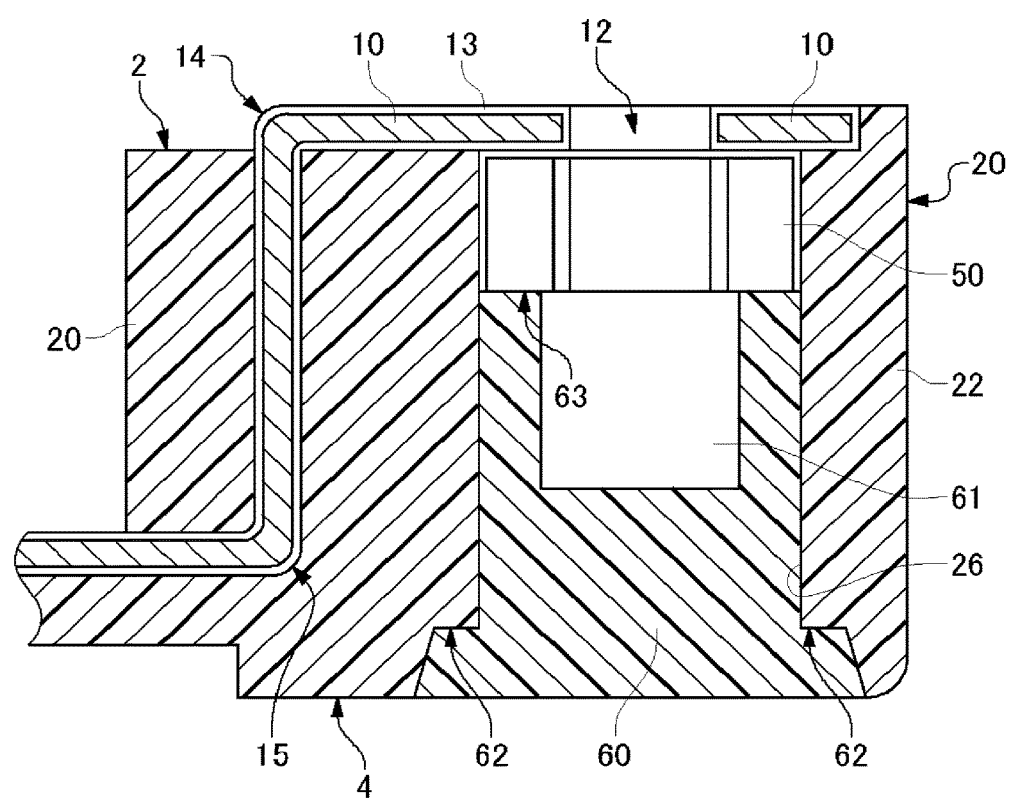
FIG. 3 is a partial cross-sectional view of the semiconductor module 1.

FIG. 3 is a partial cross-sectional view of the semiconductor module 1. The external terminal 10 may include the bent portion 14 and an internal bent portion 15. The external terminal 10 bent in the internal bent portion 15 penetrates the inner portion of the resin case 20 and is exposed on the front surface 2 of the resin case 20. The external terminal 10 is fixed to the resin case 20 by penetrating inside the resin case 20.

The tip portion being a region on a tip side of the bent portion 14 in the external terminal 10 extends in a direction with an inclination to the normal line of the front surface 2 of the resin case 20. The tip portion of the external terminal 10 may extend in a direction parallel to the front surface 2 of the resin case 20. The tip portion of the external terminal 10 extends at least to a position opposite to the through hole 26. The external terminal 10 is arranged so that a central axis of the terminal hole 12 formed in the tip portion of the external terminal 10 matches a central axis of the through hole 26. A metal film 13 is formed on the surface of the external terminal 10. The metal film 13 may be a plated film such as a nickel (Ni) plated film, a nickel (Ni)-gold (Au) based plated film, and a Sn plated film.

The through hole 26 is formed with a first region and a second region connected with each other, the first region into which the nut 50 is inserted and the second region into which the supporting portion 60 is inserted. A central axis of the first region and a central axis of the second region match with each other. Compared with the second region, the first region is formed on a side closer to the front surface 2 of the resin case 20. A cross sectional shape of the first region corresponds to the contour of the nut 50. For example, if the nut 50 is a hexagonal nut, the cross sectional shape of the through hole 26 in the first region is formed in a hexagonal shape. Accordingly, the nut 50 is fixed inside the through hole 26.

The shape of the second region of the through hole 26 may correspond to the contour of the supporting portion 60. The contour dimension of the supporting portion 60 may be the same as the inner dimension of the through hole 26. The second region of the through hole 26 is formed larger than the contour dimension of the nut 50 so that the nut 50 can pass through the second region when inserting the nut 50 into the first region of the through hole 26.

The supporting portion 60 is arranged so that an upper end 63 of the supporting portion contacts with the back surface side of the nut 50. It is desirable that the entire upper end 63 of the supporting portion contacts with the back surface side of the nut 50. The upper end 63 of the supporting portion is in a position lower than the front surface 2 of the resin case 20. A level difference between the upper end 63 of the supporting portion and the front surface 2 of the resin case 20 may be equal to or greater than a height dimension of the nut 50. Accordingly, a space for housing the nut 50 can be secured. Note that the expression "lower than the front surface 2" may mean a position in a lower direction viewed from the front surface 2.

A concave portion 61 is formed on a front surface side (upper side) of the supporting portion 60. When joining a bolt to the nut 50, the concave portion 61 houses a tip of the bolt. In this way, the supporting portion 60 functions as a receiver of a screw such as a bolt. The supporting portion 60 may be tapered so as to become thinner toward the tip side or may not be tapered. If the supporting portion 60 is tapered, the supporting portion 60 becomes to be easily inserted into the through hole 26. Particularly, in a case where the supporting portion 60 is joined in the resin case 20 by press fitting, it is desirable that the supporting portion 60 is tapered.

The material of the supporting portion 60 is not limited particularly. The supporting portion 60 may be formed of resin such as PPS resin or PBT resin. The material of the supporting portion 60 may be the same as or different from the material of the resin case 20. In one example, the resin case 20 may be formed of PPS resin which has a heat resistance higher than PBT resin and has excellent mechanical strength, insulation characteristic, and chemical resistance. The supporting portion 60 may be formed of PBT resin which has excellent moldability. The semiconductor module 1 may include a fixing portion 62 which fixes the supporting portion 60 to the resin case 20.

Figure 4:
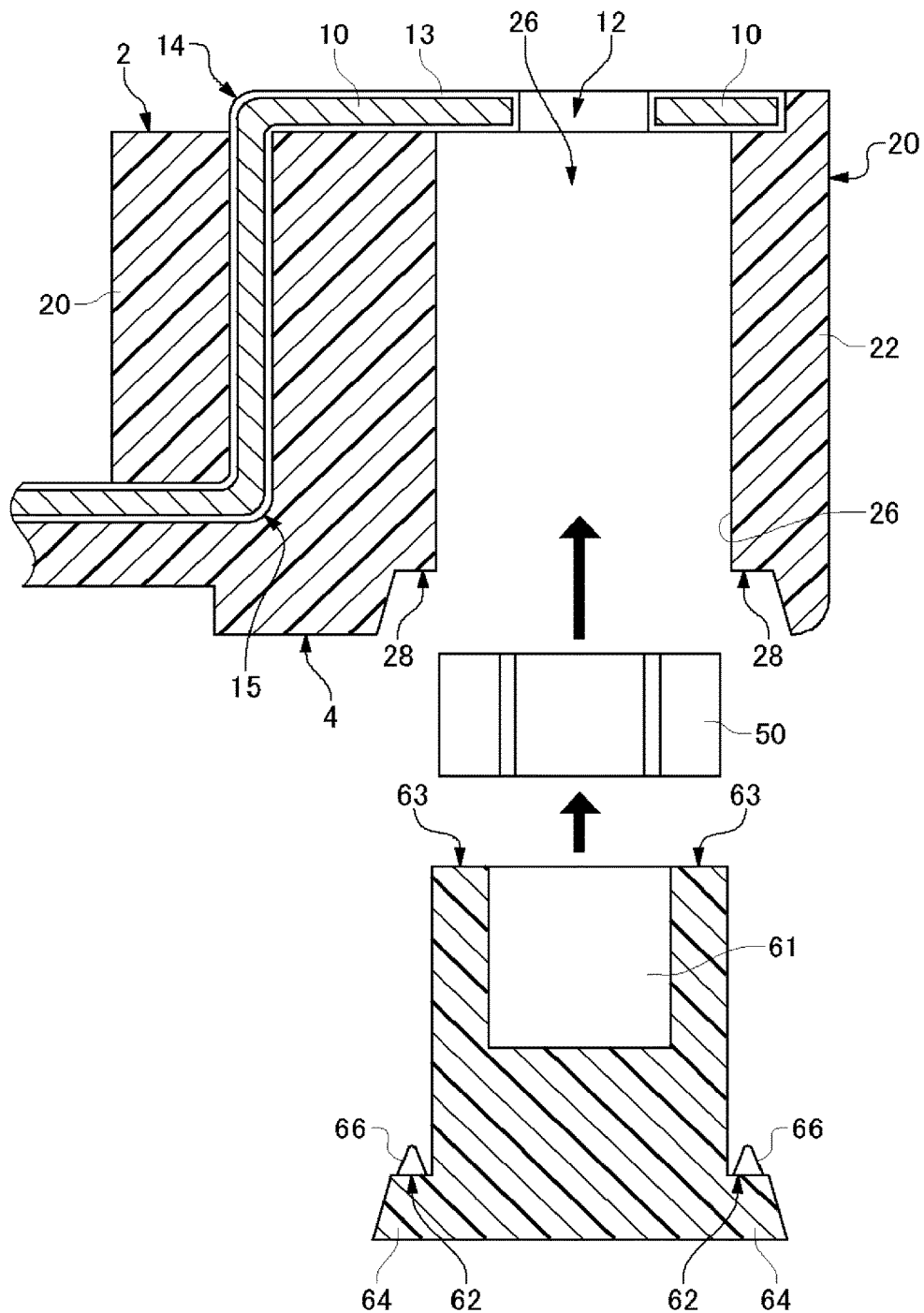
FIG. 4 is an exploded view of the semiconductor module 1.

FIG. 4 is an exploded view of the semiconductor module 1. As shown in FIG. 4, the nut 50 is inserted into the through hole 26 from a back surface 4 side of the resin case 20. The back surface 4 is a surface on the opposite side to a surface on a side where the external terminal 10 is arranged. Therefore, after the nut 50 is put in the resin case 20 from the front surface 2 side of the resin case 20, it is not necessary to fold the external terminal 10. For this reason, it is not necessary to perform a folding process after plating the external terminal 10. Therefore, in the semiconductor module 1 of the present example, no crack of the metal film 13 exists in the bent portion 14 of the external terminal 10.

In a case where the folding process is to be performed after the external terminal 10 is plated, given an example of nickel plating, if the thickness of the plated film exceeds 1 µm, a crack of the plated film becomes to be easily generated. On the other hand, if the plated film is made thin, a partial defect in the plated film becomes to be easily generated. According to the present example, even if the thickness of the plated film is made exceeding 1 µm, no crack of the plated film exists. Therefore, it is not necessary to make the thickness of the plated film be equal to or less than 1 µm and the generation of the partial defect of the plated film can be prevented.

On the back surface 4 side of the resin case 20, a flange portion 64 protruding in the side-surface direction may be provided to the supporting portion 60. In the present example, the upper surface of the flange portion 64 of the supporting portion 60 is welded with an opposite surface 28 in the resin case 20 to form a welded portion. In the present example, the welded portion of the upper surface of the flange portion 64 functions as the fixing portion 62 to fix the supporting portion 60 to the resin case 20. The upper surface of the flange portion 64 of the supporting portion 60 and the opposite surface 28 of the resin case 20 may be welded with each other by ultrasonic bonding.

Before performing the ultrasonic bonding, a projecting portion 66 may be provided to a bonding surface between the supporting portion 60 and the resin case 20. In the present example, the projecting portion 66 is provided to the upper surface of the flange portion 64. The projecting portion 66 may be integrally formed as a part of the supporting portion 60. Different from the present example, the projecting portion 66 may be provided to the opposite surface 28 of the resin case 20. The projecting portion 66 is melt by an ultrasonic vibration when performing the ultrasonic bonding. The resin resulted from the projecting portion 66 melting fills a gap between the resin case 20 and the supporting portion 60. Therefore, by providing the projecting portion 66, a bonding strength and an airtightness of the ultrasonic bonding can be improved.

According to the present example, a surface between the upper surface of the flange portion 64 and the opposite surface 28 in the resin case 20 can be set as the bonding surface. Therefore, in a state that the supporting portion 60 is inserted into the resin case 20, when the ultrasonic vibration is applied while the external terminal 10 of the resin case 20 and the supporting portion 60 are interposed by an ultrasonic element (horn) in a vertical direction, the pressure becomes to be easily applied to the bonding surface, and the bonding strength and the airtightness can be improved.

However, the fixing portion 62 is not limited to this case. The fixing portion 62 may be a welded portion formed in another position other than the upper surface of the flange portion 64. The supporting portion 60 and the resin case 20 may be adhered to each other by an adhesive which is applied between the supporting portion 60 and the surface of the resin case 20. In this case, the adhesive layer functions as the fixing portion 62. Different from the present example, the fixing may be performed by the supporting portion 60 being press fit into the through hole 26.

According to the semiconductor module 1 of the present example configured as described above, since no crack of the metal film 13 such as a plated film is generated in the bent portion 14 of the external terminal 10, a discolor due to the oxidization of the external terminal 10 and the like can be prevented. Therefore, it can prevent the appearance of the external terminal 10 from being impaired.

Figure 5:
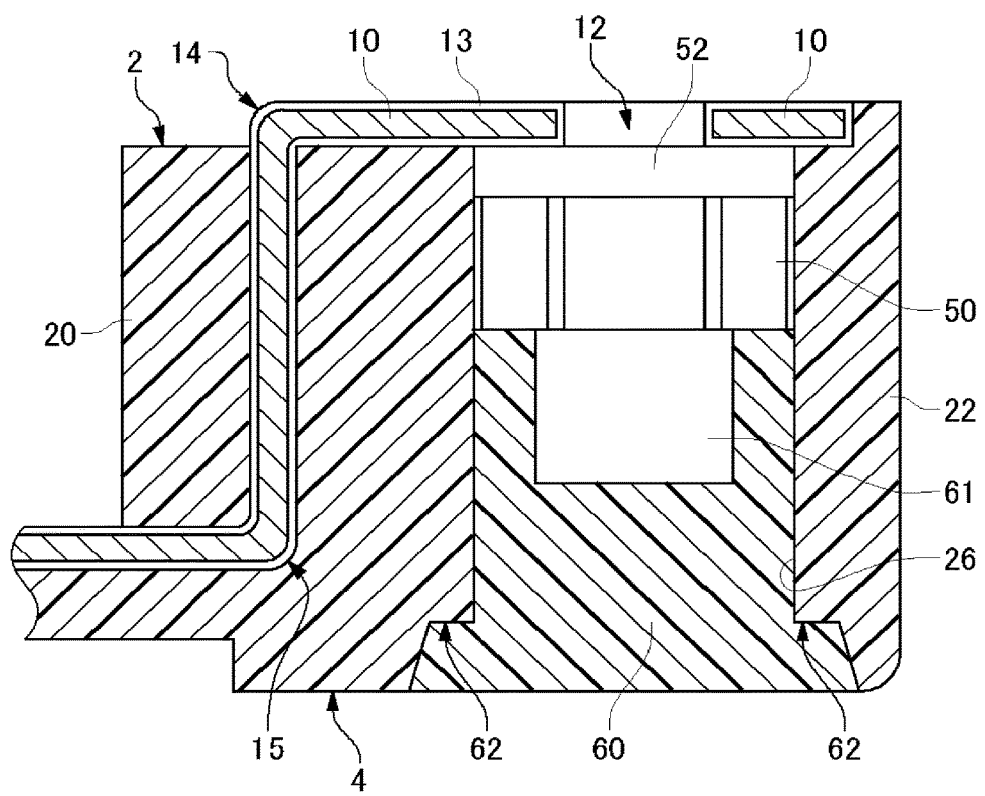
FIG. 5 is a partial cross-sectional view showing the semiconductor module 1 of a second embodiment of the present invention.

FIG. 5 is a partial cross-sectional view showing the semiconductor module 1 of a second embodiment of the present invention. The semiconductor module 1 of the present example is arranged inside the through hole 26 so that the nut 50 as the fastening portion is spaced from the external terminal 10. Other configurations are similar to those of the semiconductor module 1 of the first embodiment.

In the present example, the nut 50 and the external terminal 10 are spaced from each other in the vertical direction. No resin exists in a gap 52 between the nut 50 and the external terminal 10. The gap 52 means a space between the upper surface of the nut 50 and a back surface in the tip portion of the external terminal 10. Accordingly, when joining the supporting portion 60 to the resin case 20 by ultrasonic bonding, the ultrasonic vibration is easily transmitted concentrating to a position between the upper surface of the above-described flange portion 64 and the opposite surface 28 of the resin case 20, i. e. the portion of the fixing portion 62 in the drawing.

Therefore, the bonding strength and the airtightness between the supporting portion 60 and the resin case 20 can be improved.

Figure 6:
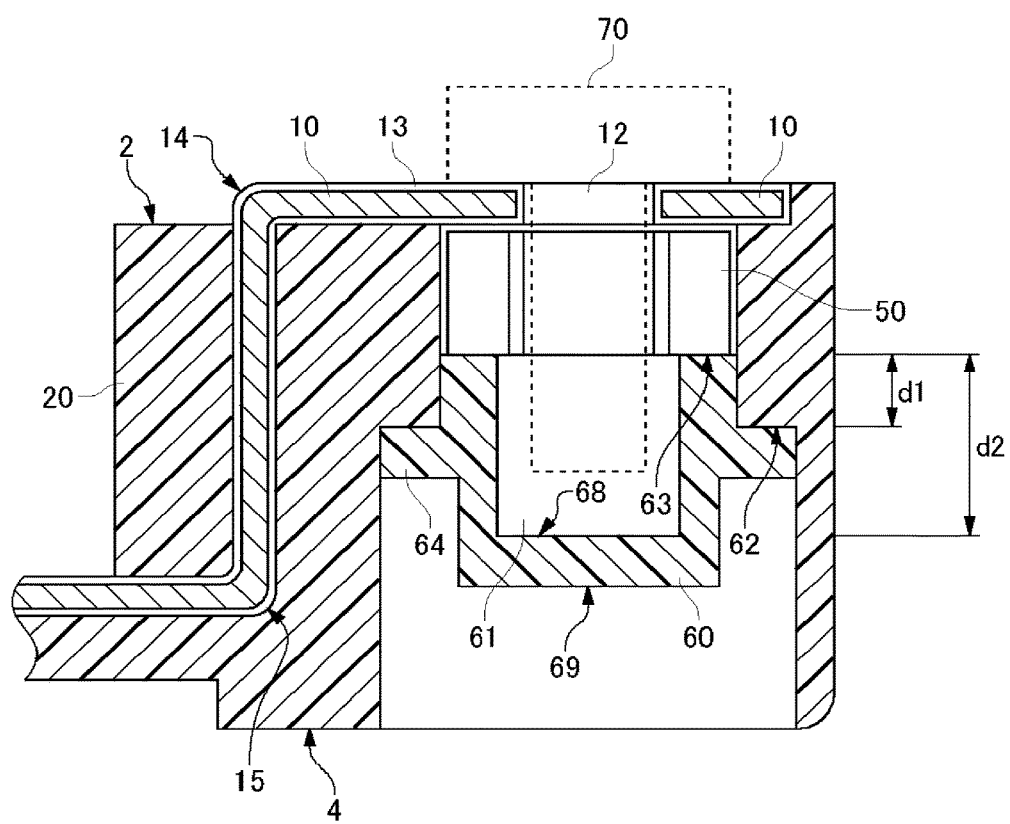
FIG. 6 is a partial cross-sectional view showing the semiconductor module 1 of a third embodiment of the present invention.

FIG. 6 is a partial cross-sectional view showing the semiconductor module 1 of a third embodiment of the present invention. In the present example, a concave portion 61 is formed in the supporting portion 60, which houses a bolt 70 that joins to the nut 50. A distance d2 from the upper end 63 of the supporting portion contacting with the nut 50 to a bottom portion 68 of the concave portion 61 is longer than a distance d1 from the upper end 63 of the supporting portion to the fixing portion 62.

In the present example, the position of the fixing portion 62 may be a position of the upper surface of the flange portion 64, which is the bonding surface between the supporting portion 60 and the resin case 20. The supporting portion 60 includes a protruding portion 69 which protrudes downward than the bonding surface between the supporting portion 60 and the resin case 20. The concave portion 61 housing the bolt 70 is extended to the inner portion of the protruding portion 69. Other configurations are similar to those of the semiconductor module 1 of the first embodiment and the second embodiment.

According to the present example, since the concave portion 61 housing the bolt 70 can be extended, the bolt 70 which is longer than the distance from the upper surface of the external terminal 10 to the fixing portion 62 can be applied. Particularly, a bolt used in the mounting hole 25 formed in the mounting portion 24 described in FIG. 1 is long in size. According to the present example, since the bolt 70 longer than a prescribed length can be applied, the bolt 70 to be inserted into the terminal hole 12 can be used in common with a bolt used in the mounting hole 25.

Figure 8A:
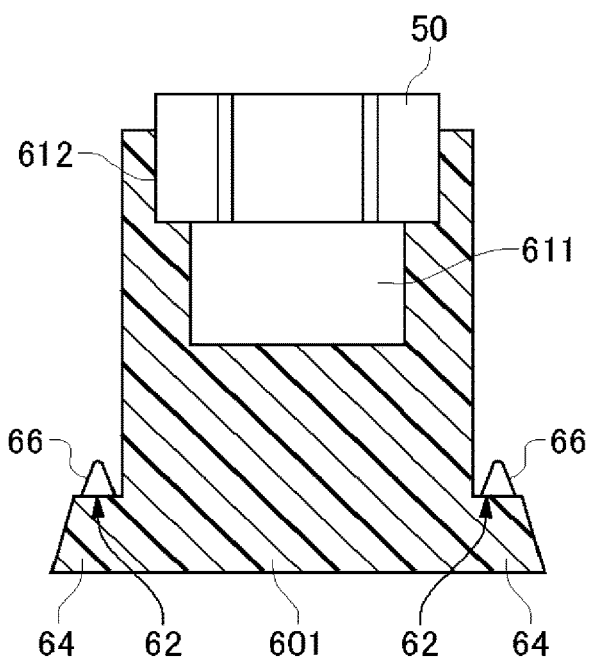
FIG. 8A is a partial cross-sectional view showing a nut 50 and a supporting portion 601 used in the semiconductor module 1 of a fourth embodiment of the present invention.
Figure 8B:
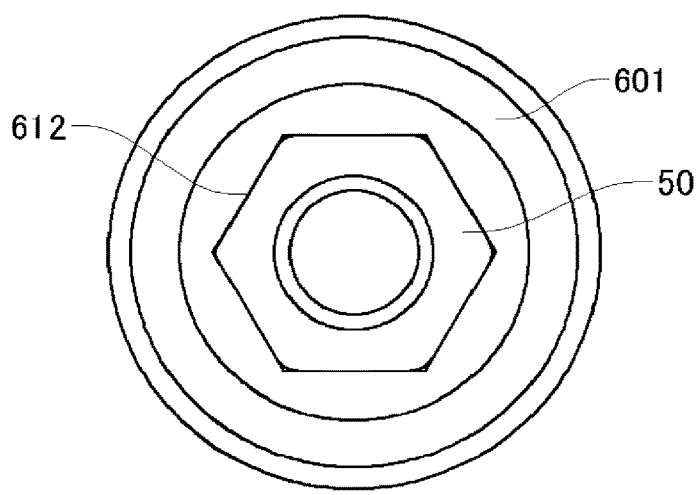
FIG. 8B is a top view showing the nut 50 and the supporting portion 601 used in the semiconductor module 1 of the fourth embodiment of the present invention.

FIG. 8A and FIG. 8B are a partial cross-sectional view and a top view showing the nut 50 and the supporting portion 601 used in the semiconductor module 1 of a fourth embodiment of the present invention. The supporting portion 601 in the present example includes a concave portion 611 housing the tip of the bolt and a concave portion 612 housing the nut 50. A level difference for receiving the nut 50 is provided between the concave portion 611 and the concave portion 612. As shown in FIG. 8B, the concave portion 612 has a cross section corresponding to the contour of the nut 50. Since the shape of the concave portion 612 corresponds to the nut 50, the nut 50 is fixed inside the concave portion 612, and accordingly, an idling of the nut 50 when bolt fastening is suppressed. In a case where the supporting portion 601 is used, the first region and the second region of the through hole 26 may be both in a shape into which the supporting portion 601 may be inserted. The cross sectional shape of the supporting portion 601 may be, for example, a circular shape or a polygonal shape.

Figure 7:
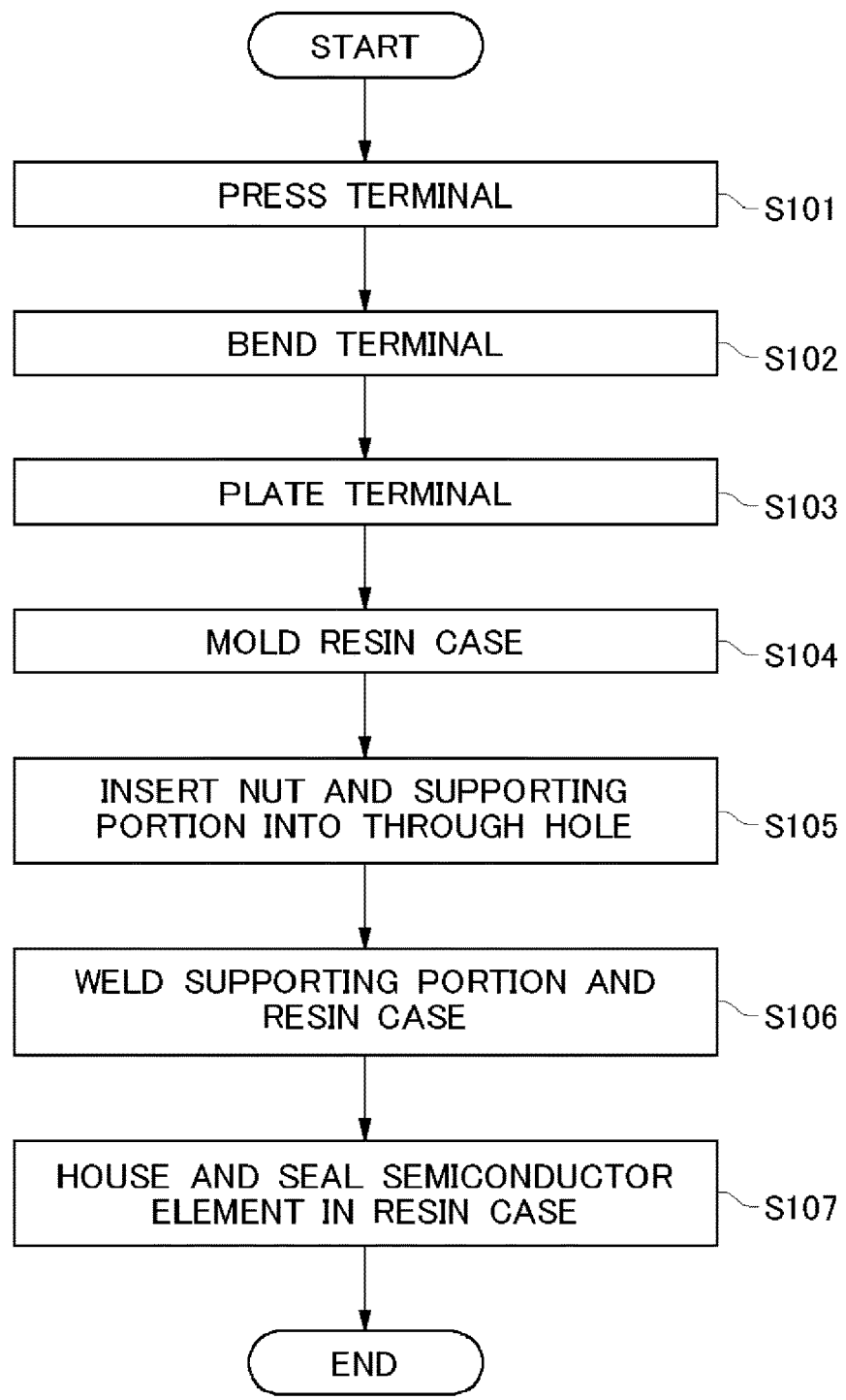
FIG. 7 is a flow chart showing one example of a method of manufacturing the semiconductor module 1.

The semiconductor module 1 of the first to the fourth embodiment can be manufactured as the followings. FIG. 7 is a flow chart showing one example of a method of manufacturing the semiconductor module 1. A pressing process is performed on the external terminal 10 (Step S101). Next, a bending process is performed on the external terminal 10 (Step S102). In the pressing step (Step S101) and the bending step (step S102), the external terminal 10 is worked in a bent shape in the bent portion 14 and the internal bent portion 15.

In the pressing process (Step S101), the bent portion 14 may be formed in the external terminal 10, and in the bending process (Step S102), the internal bent portion 15 may be formed in the external terminal 10. Conversely, in the pressing process (Step S101), the internal bent portion 15 may be formed in the external terminal 10, and in the bending process (Step S102), the bent portion 14 may be formed in the external terminal 10.

According to the present example, it is not necessary to make the external terminal 10 be in a state of being fixed to the resin case 20 for the bending process. When performing the bending process, since the resin case 20 does not receive forces, the generation of cracks of the resin case 20 can be prevented.

Next, a plating process is performed on the bent external terminal 10 (Step S103). According to the plating step (Step S103) in the manufacturing method of the present example, the plating process is performed on the external terminal 10 in a state that the external terminal 10 is not fixed to the resin case 20. Therefore, it is not necessary to immerse the entire resin case 20 in the plating liquid. For that reason, it can prevent the resin case 20 from receiving an influence of the plating liquid.

Next, after loading the plated external terminal 10 in a mold, melt resin is injected into the mold. Resin case 20 is molded by solidifying the resin in the mold (Step S104). For example, by injecting the resin around the external terminal 10 inserted into the mold, an insert molding where the external terminal 10 is integrated with the resin is performed. In the resin molding step (Step S104), the external terminal 10 is fixed to the resin case 20. In the resin molding step (Step S104), the through hole 26 is formed in the resin case 20 in a position opposite to the external terminal 10. Therefore, in the resin molding step (Step S104), an alignment between the through hole 26 of the resin case 20 and the terminal hole 12 in the tip portion of the external terminal 10 is completed. In this way, the external terminal 10 and the resin case 20 are prepared, the external terminal 10 plated and including the bent portion, the resin case 20 to which the external terminal 10 is fixed, the resin case 20 with the through hole 26 formed opposite to the external terminal 10.

As described in FIG. 4, the nut 50 as the fastening portion and the supporting portion 60 are inserted into the through hole 26 (Step S105). In the front surface 2 of the resin case 20, the tip portion of the external terminal 10 covers the through hole 26. However, according to the manufacturing method of the present example, because the through hole 26 has been formed in the resin case 20, in the inserting step (Step S105), the nut 50 and the supporting portion 60 can be inserted in this order from the back surface 4 side of the resin case 20. The through hole 26 also functions as a guide mechanism for positioning the nut 50. Since the nut 50 is positioned according to the through hole 26, the alignment of the nut 50 can be omitted.

Next, the resin case 20 and the supporting portion 60 are welded to each other (Step S106). According to the present example, it is not necessary to load the resin case 20 and other components in the mold again to perform a secondary molding. Therefore, an alignment between components when performing secondary molding is not necessary, either. In the welding step (Step S106), the ultrasonic bonding may be performed on the resin case 20 and the supporting portion 60. In a state that the supporting portion 60 is inserted into the resin case 20, the resin case 20 and the supporting portion 60 may be interposed by the ultrasonic element in the vertical direction and then the ultrasonic vibration may be applied.

Particularly, as described in FIG. 4, in a case where the surface between the upper surface of the flange portion 64 and the opposite surface 28 in the resin case 20 is set as the bonding surface, since the pressure is applied to the bonding surface easily, the bonding strength and the airtightness can be improved. However, instead of welding by the ultrasonic bonding, the resin case 20 and the supporting portion 60 may be joined to each other by a press fitting process or an adhering process with an adhesive. In a state that a wiring work in the internal circuit including the semiconductor element 40 is completed, a space surrounded by the resin case 20 is filled with a sealing resin 23 to seal the space (Step S107). A detailed description for the sealing step (Step S107) is omitted since it is similar to a conventional process.

As described above, according to the method of manufacturing the semiconductor module of the present example, the semiconductor module 1 which prevents the crack of the plated film in the external terminal 10 can be provided, without loading the resin case 20 and other components in the mold again for secondary molding. Also, in the resin molding step of the resin case 20 (Step S104), the alignment between the through hole 26 and the external terminal 10 has been completed, and after that, since the through hole 26 can be used as a guide mechanism for positioning, it is not necessary to perform the alignment again.

While the embodiments of the present invention have been described, the technical scope of the invention is not limited to the above described embodiments. Each embodiment in the present specification can be appropriately combined. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1 . . . semiconductor module, 2 . . . front surface, 4 . . . back surface, 10 . . . external terminal, 12 . . . terminal hole, 11 . . . control terminal, 13 . . . metal film, 14 . . . bent portion, 15 . . . internal bent portion, 20 . . . resin case, 21 . . . wall portion, 22 . . . terminal placement portion, 23 . . . sealing resin, 24 . . . mounting portion, 25 . . . mounting hole, 26 . . . through hole, 28 . . . opposite surface, 30 . . . laminated substrate, 32 . . . insulation layer, 33 . . . metal layer, 34 . . . circuit layer, 35 . . . connection layer, 38 . . . metal base plate, 40 . . . semiconductor element, 42 . . . electrode, 44 . . . bonding wire, 50 . . . nut, 52 . . . gap, 60 . . . supporting portion, 61 . . . concave portion, 62 . . . fixing portion, 63 . . . upper end of supporting portion, 64 . . . flange portion, 66 . . . projecting portion, 68 . . . bottom portion, 69 . . . protruding portion, 70 . . . bolt, 601 . . . supporting portion, 611 . . . concave portion, 612 . . . concave portion

What is claimed is:

1. A semiconductor module, comprising:
   a semiconductor element;
   a terminal with a metal film formed on a surface, the terminal including a bent portion;
   a resin case to which the terminal is fixed and in which a through hole is formed opposite to the terminal, the resin case housing the semiconductor element;
   a fastening portion provided inside the through hole; and
   a supporting portion provided inside the through hole and supporting the fastening portion, the supporting portion being formed of resin and including a fixing portion which fixes the supporting portion to the resin case, wherein
   a concave portion is formed in the supporting portion, the concave portion housing a bolt that joins the fastening portion, and
   a distance from an upper end of the supporting portion to a bottom portion of the concave portion is longer than a distance from the upper end of the supporting portion to the fixing portion.

2. The semiconductor module according to claim 1, wherein
   the fastening portion is arranged inside the through hole so as to be spaced from the terminal.

3. The semiconductor module according to claim 2, wherein
no resin exists between the fastening portion and the terminal inside the through hole.

4. The semiconductor module according to claim 1, wherein
an upper end of the supporting portion is positioned lower than a front surface of the resin case.

5. The semiconductor module according to claim 1, wherein no crack of the metal film exists in the bent portion.

6. A method of manufacturing a semiconductor module, comprising:
preparing a terminal, the terminal plated and including a bent portion, and a resin case to which the terminal is fixed and in which a through hole is formed opposite to the terminal;
inserting into the through hole a fastening portion and a supporting portion which supports the fastening portion, the supporting portion being formed of resin and provided with a concave portion to house a bolt that joins the fastening portion;
fixing the supporting portion to the resin case, such that a distance from an upper end of the supporting portion to a bottom portion of the concave portion is longer than a distance from the upper end of the supporting portion to a portion where the supporting portion is fixed to the resin case; and
housing and sealing a semiconductor element in the resin case.

7. The method of manufacturing the semiconductor module according to claim 6, wherein
the preparing further comprises:
bending a terminal;
plating the bent terminal; and
after loading the plated terminal in a mold, molding a resin case by injecting resin in the mold, the resin case with a through hole formed opposite to the terminal.

8. The method of manufacturing the semiconductor module according to claim 6, wherein
fixing the supporting portion to the resin case includes ultrasonic-welding.

9. The semiconductor module according to claim 1, wherein
a concave portion is formed in the supporting portion, the concave portion housing a bolt that joins the fastening portion.

10. The semiconductor module according to claim 1, wherein
the supporting portion is wider in a bottom portion than in a top portion.

11. A semiconductor module, comprising:
a semiconductor element;
a terminal with a metal film formed on a surface, the terminal including a bent portion;
a resin case to which the terminal is fixed and in which a through hole is formed opposite to the terminal, the resin case housing the semiconductor element;
a fastening portion provided inside the through hole;
a supporting portion provided inside the through hole and supporting the fastening portion, the supporting portion including a fixing portion which fixes the supporting portion to the resin case; and
a projecting portion provided on a surface between the supporting portion and the resin case, the projecting portion filling a gap between the supporting portion and the resin case upon being melted.

* * * * *